United States Patent [19]
Brox

[11] Patent Number: 6,016,281
[45] Date of Patent: Jan. 18, 2000

[54] MEMORY WITH WORD LINE VOLTAGE CONTROL

[75] Inventor: Martin Brox, Munich, Germany

[73] Assignee: Siemens Aktiengesellschaft, Munich, Germany

[21] Appl. No.: 08/992,378

[22] Filed: Dec. 17, 1997

[51] Int. Cl.[7] .................................................. G11C 8/00
[52] U.S. Cl. ................ 365/230.06; 365/201; 365/149; 365/189.11; 365/189.06
[58] Field of Search ..................... 365/230.06, 189.06, 365/189.11, 201, 149

[56] References Cited

U.S. PATENT DOCUMENTS

5,297,104  3/1994  Nakashima ........................ 365/230.06

*Primary Examiner*—David Nelms
*Assistant Examiner*—Andrew Q. Tran
*Attorney, Agent, or Firm*—Stanton C. Braden

[57] ABSTRACT

In a memory array, decoding circuitry for selectively applying a turn-off voltage to selected word lines of the memory array for turning off conduction in the main conduction paths of the transistors whose gate electrodes are connected to the selected word lines and for selectively applying an increased turn-off voltage to selected word lines. The application of different values of turn-off voltage may be used to test the susceptibility of the memory array to gate induced drain leakage (GIDL) and to determine an optimum range of turn-off voltages to be applied to the word lines for operation with reduced leakage.

14 Claims, 5 Drawing Sheets

MEMORY WITH WORD LINE VOLTAGE CONTROL

BACKGROUND OF THE INVENTION

This invention relates to memory devices such as dynamic random access memories (DRAMs) and, in particular, to a method and apparatus for sensing and/or controlling certain leakage currents associated with memory cells of the DRAM.

Figure 1:
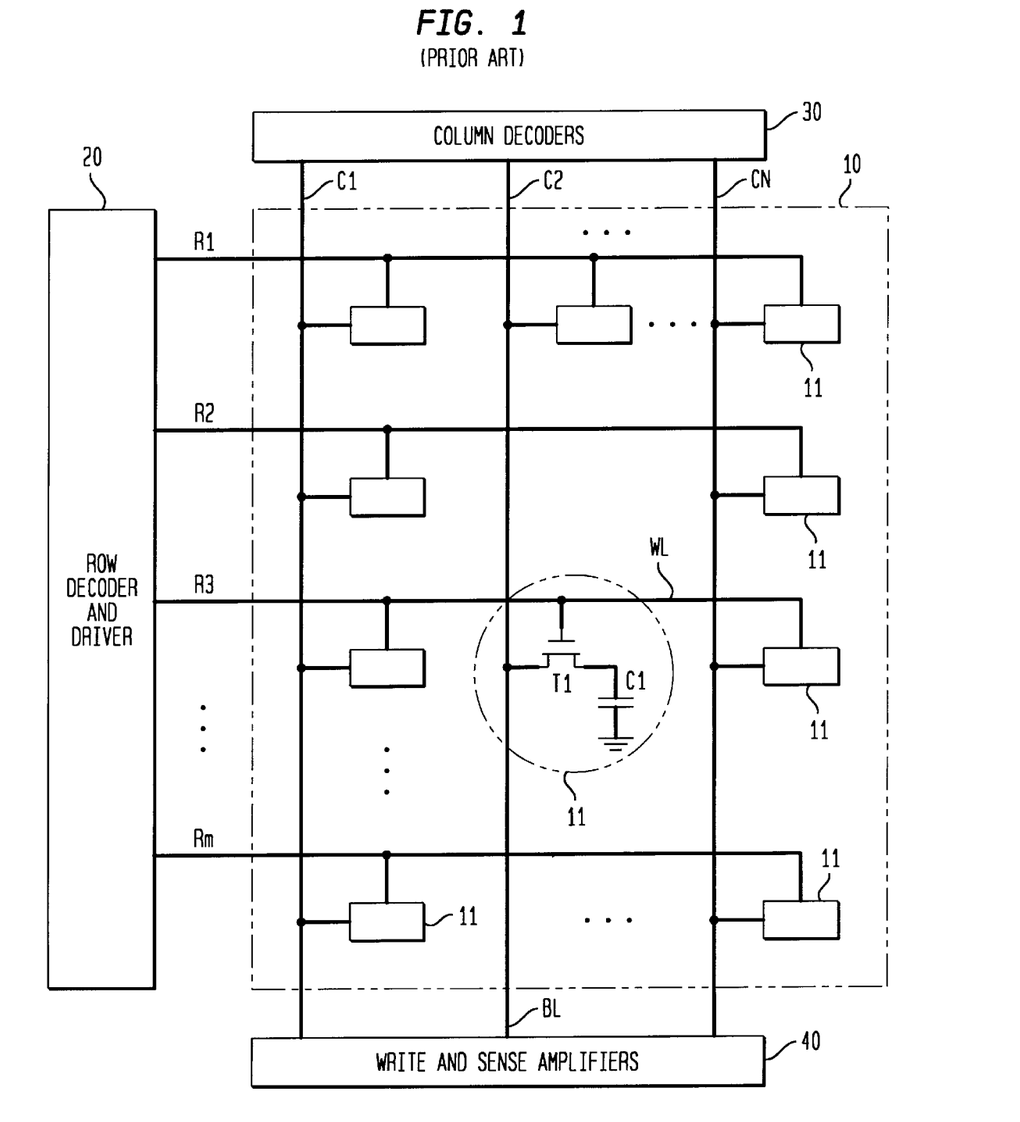
FIG. 1 is a block diagram of a prior art DRAM memory array.

To better understand certain problems faced by Applicant, and the inventive resolution of these problems, reference is first made to FIG. 1 which shows a memory array 10 comprised of memory cells 11. For purpose of illustration, the array 10 is shown to have M rows, with one row conductor or word line (WL) per row and to have N columns, with one column conductor or bit line (BL) per column. A memory cell 11 is located at the intersection of each row and column conductor. The row conductors, or word lines, are driven by a row decoder and driver circuit 20 and the column conductors, or bit lines, are driven by a column decoder and driver circuit 30. A write/sense circuit 40 includes circuitry for writing information onto the bit lines for transmission to selected memory cells and circuitry to sense information read from selected memory cells and coupled onto the bit lines.

Generally, in the operation of the memory array of FIG. 1, where the memory cell transistors are N-conductivity type MOS transistors and where the operating potential applied to the memory is VDD volts (e.g., +5 volts) and ground (e.g., zero volts), a word line is activated (selected or enabled) by the application thereto of a "high" voltage (e.g., VDD volts) and the word line is deactivated (not-selected, disabled or in stand-by condition) by the application thereto of a "low" voltage (e.g., zero volts). In FIG. 1, the M word lines of the array 10 are selectively enabled by means of row driver circuit 20 which has M decoder/driver circuits, each of which may be of the type shown in FIG. 2. The decoder driver of FIG. 2 includes a P type transistor, P1, having its source-to-drain path connected between a signal terminal 211 and an output terminal 213 to which is connected its associated word line (WL). The substrate 212 of P1 is connected to a terminal 214 to which is applied a fixed potential (e.g., VDD volts). The source-to-drain paths of transistors N1 and N2 are connected in parallel between output terminal 213, which is connected to a word line (WL), and a terminal 216 to which is applied ground potential. The substrates 217 of N1 and N2 are also returned to ground potential. A first partially decoded signal, RDEC, is applied to the gates of transistors P1 and N1 and a second partially decoded signal, WLD, is applied to signal terminal 211. A signal WLK (typically the inverse of WLD) is applied to the gate of N2 to enable the word line to be selectively clamped to ground for certain input signal conditions.

Figure 2:
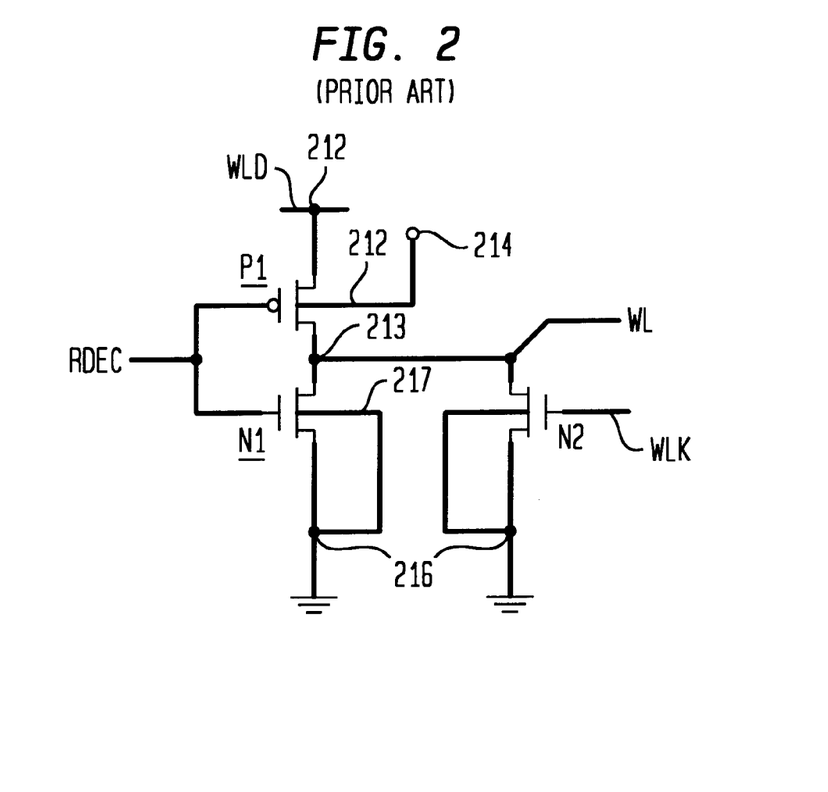
FIG. 2 is a schematic diagram of a prior art decoder/driver circuit.

The circuit of FIG. 2 is used to activate a selected word line. When the signal RDEC is "low" and the signal WLD is a "high" (and WLK is "low"), a "high" is applied to the word line, activating it and enabling the memory cell transistors whose gates are connected to the word line. When the signal RDEC is "high" and/or when the signal WLK is "high", a "low" (e.g., ground) is applied to the word line and it is deemed "deselected" or "deactivated" since the memory cell transistors whose gates are connected to the word line are turned-off. Thus, the circuit of FIG. 2 may be used to apply either an activation (turn-on) voltage (e.g., VDD volts) to the word lines or a deactivation (turn-off) voltage (e.g., zero volts) to the word lines.

The ability to apply a single fixed turn-off voltage is unsatisfactory in certain applications. This is best explained by noting that the memory cells of DRAMs are subject to leakage currents which can destroy the data stored in the memory cells of the DRAM. Therefore, it is necessary to test the cells of a memory array to ensure that their leakage is within acceptable limits. Where, for example, the memory cell transistors are of N-conductivity type, the testing is normally done by first activating the word lines of the memory array by applying a high voltage to them and writing a "high" into the cells by charging their storage capacitors to a high voltage. The word lines are then deactivated by applying zero volts to the word lines for a known period of time. After the known time period has passed the memory cells are selectively read out to determine their data retention. With the circuit of FIG. 2, when a word line is deactivated a single, fixed, turn-off voltage of, for example, zero volts is applied to a word line when it is deselected.

Figure 4:
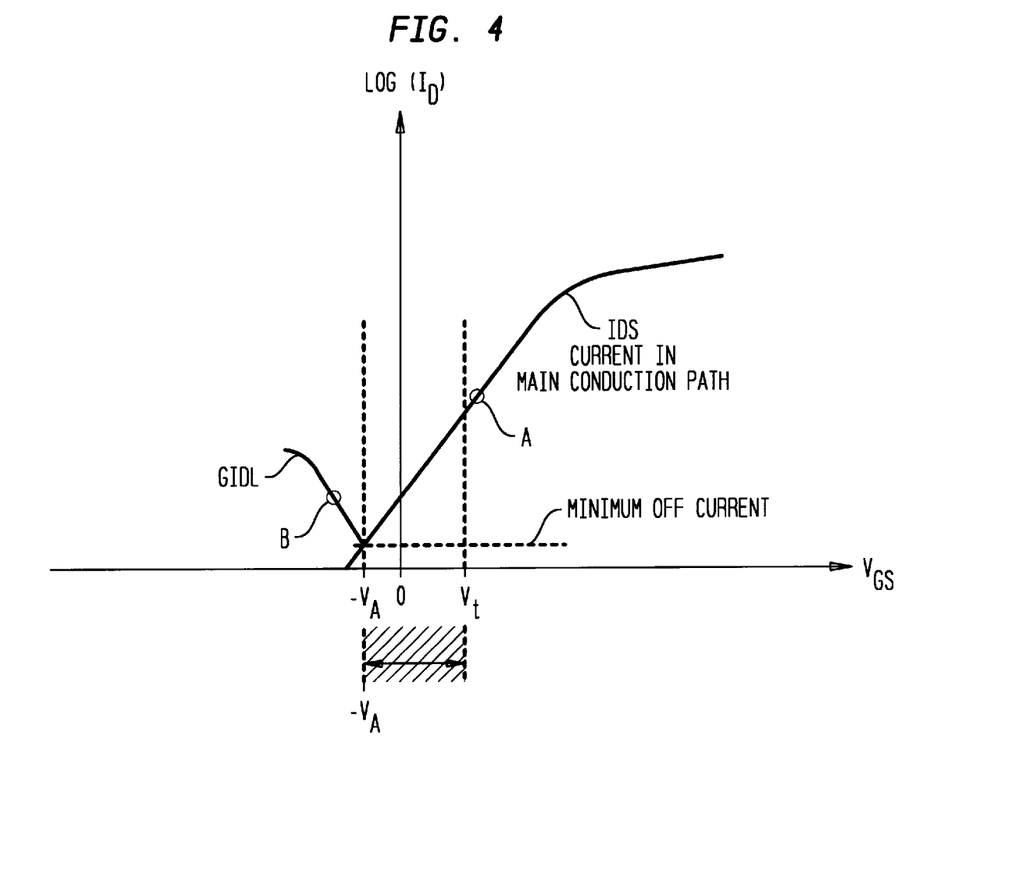
FIG. 4 is a diagram of the main current (IDS) and leakage current (IL) associated with memory cell transistors as a function of gate voltage.

This is unsatisfactory because the leakage of the memory cell transistors varies as a function of the amplitude and polarity of the turn-off voltage applied to their gates, as shown in FIG. 4. Thus, the circuit of FIG. 2 does not permit testing the leakage of the memory cells for different values of turn-off voltage applied to the word lines.

Accordingly, it is an object of this invention to provide circuitry for enabling the application of different values of turn-off voltages to the word lines of a memory array.

It is another object of this invention to sense leakage currents such as the gate induced drain leakage (GIDL) of memory cell transistors for different values of word line voltage.

It is also an object of this invention to determine whether certain turn-off voltages reduce or increase leakage currents such as GIDL.

SUMMARY OF THE INVENTION

Applicant's invention resides, in part, in the recognition that it may be desirable and/or necessary to test, or operate, a memory array by applying different values of turn-off voltages to the word lines of a memory array. In particular, Applicant recognized that it is desirable to test the leakage of memory cell transistors by applying turn-off voltages to their gates which exceed in amplitude and polarity the normal turn-off voltage applied to their gates.

Applicant also recognized that it may be desirable and/or necessary to make a memory array which includes circuitry to enable different turn-off voltages to be applied to the word lines of the memory array.

Applicant's invention also resides in circuitry for applying either a normal turn-off voltage (e.g., zero volts for an N-type transistor) or a greater than normal (e.g., −1 volt for an N-type transistor) turn-off voltage to the gates of memory cell transistors.

Memory systems embodying the invention include circuitry for applying a first turn-off voltage to selected word lines for turning-off current conduction in the main conduction path of the memory cell transistors whose gates are connected to these word lines and for selectively applying an increased turn-off voltage to selected word lines for more sharply turning-off the memory cell transistors whose gates are connected to these word lines.

In one embodiment of the invention, turn-off voltages ranging in value are applied to the word lines to test the susceptibility of the memory cells to gate induced drain leakage (GIDL) current. For a first range of increasing turn-off voltage applied to the word lines the leakage current of the transistors whose gates are connected to the word lines decreases. For a further increase in the turn-off voltage applied to the word lines the leakage current of the transistors whose gates are connected to the word lines increases. Determining the range of turn-off voltage for which the leakage is a minimum and the range for which the leakage increases may be used to set the limit of the amplitude of turn-off voltage and to select an appropriate range of turn-off voltages. Also, the turn-off voltages tending to increase the leakage current may be used to test the susceptibility of the memory cell transistors to gate induced drain leakage (GIDL) currents. This testing enables the detection and correction or rejection of potentially defective memory products, thus leading to the manufacture of a more reliable product.

A method embodying the invention includes the steps of: (a) writing a certain signal condition (e.g., a High) to be stored in the memory cells of a memory array; (b) applying a first turn-off voltage for a first time period to selected word lines of the memory array; (c) sensing the contents of the memory cells to determine the effect, if any, of leakage currents with the first turn-off voltage on selected memory cells; (d) rewriting the certain signal condition in the memory array; (e) applying a second turn-off voltage for a period of time generally equal to said first time period; and (f) sensing the contents of the memory cells to determine the effect of leakage currents for the second value of turn-off voltage on the selected memory cells; and, wherein one of said first and second turn-off voltage is of greater amplitude than the other.

Accordingly, memory systems embodying the invention include circuits for testing the susceptibility of the memory cells to gate induced drain leakage (GIDL) as a function of turn-off voltage. The testing of the memory cells may be used to set the word line turn-off voltage and/or to replace defective rows and columns with redundant rows and columns, and/or reject defective memory arrays.

BRIEF DESCRIPTION OF THE DRAWING

In the accompanying drawing like reference characters denote like components.

DETAILED DESCRIPTION OF THE INVENTION

Figure 3A:
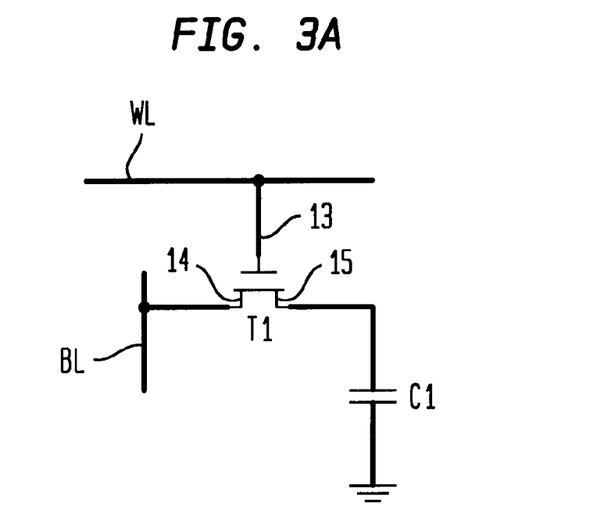
FIG. 3A is a simplified schematic diagram of a single memory cell.
Figure 3B:
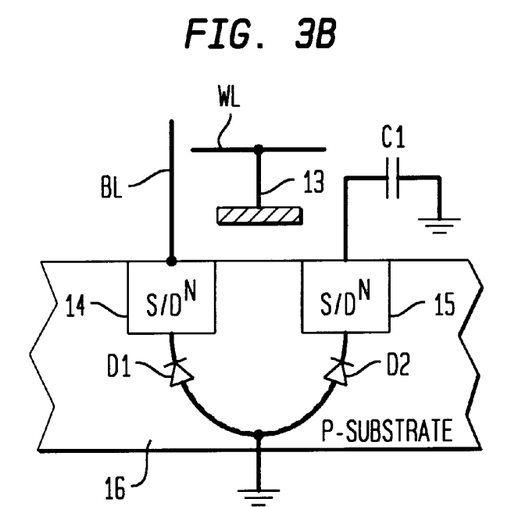
FIG. 3B is a cross section diagram of the circuit of FIG. 2A showing the presence of parasitic junctions.
Figure 3C:
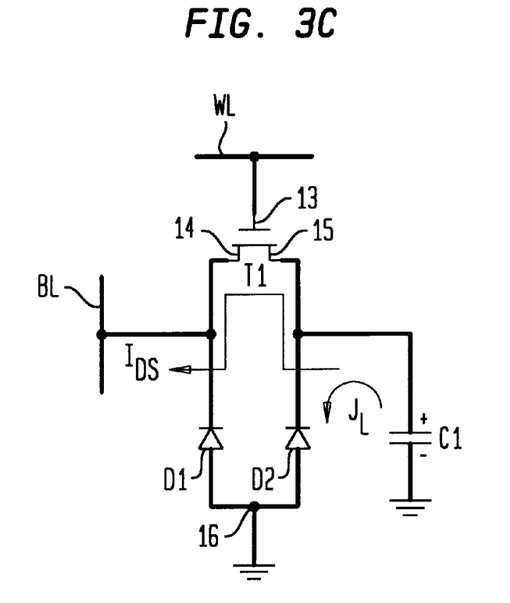
FIG. 3C is a schematic diagram of the memory of FIG. 2A including parasitic diodes shown in FIG. 2B.

To better understand the description of the invention to follow, a leakage mechanism of primary concern will first be examined. A memory cell 11 of the memory array 10 shown in FIG. 1 includes a transistor T1 and a storage capacitor C1. As further detailed in FIGS. 3A, 3B and 3C, transistor (T1) has a gate electrode 13, which is connected to its associated word line (WL), a first electrode 14, which functions as source or drain, connected to its associated bit line (BL), and a second electrode 15, which also functions as a drain or source, connected to one end of a storage capacitor, C1. FIG. 3B is a cross-sectional diagram of the memory cell of FIG. 3A and shows that N-regions 14 and 15 are formed in a P-substrate 16. Regions 14 and 15 define the ends of the main conduction path in substrate 16. N region 14 also forms a PN junction with substrate 16 identified as "parasitic" diode D1, and N region 15 also forms a PN junction with substrate 16 identified as "parasitic" diode D2. These parasitic diodes, D1 and D2, may be the source of leakage as described below. Diodes D1 and D2 are normally operated in a reverse biased condition by maintaining the substrate voltage more negative than the voltages at the source drain regions 14 and 15. In FIG. 3B, the substrate 16 is shown to be grounded. However, a small negative bias of Vbb volts (where Vbb is, for example, equal to −1 volt) may be applied to the substrate 16. FIG. 3C is a schematic diagram of the memory cell of FIG. 3B including the parasitic diodes D1 and D2. For ease of illustration in the discussion to follow it will be assumed that the memory cell transistors (T1) are metal-oxide-semiconductor (MOS) transistors of N-conductivity type. N-type transistors are used by way of example only and different types of transistors (e.g., P-type) could be used instead.

For ease of explanation in the discussion to follow note that an MOS transistor is a device having: (a) source and drain electrodes defining the ends of a main conduction path: and (b) a gate electrode overlying the main conduction path whose applied voltage controls the conductivity of the main conduction path. An N-type transistor is turned-on when its gate potential exceeds its source potential by more than the threshold voltage (Vt) of the transistor. The source electrode of the N-type transistor is defined as that one of the first and second electrodes having the lower potential applied thereto. Since an N-type transistor (as well as a P-type transistor) when operated as a gating transistor can conduct bidirectionally, which electrode is the source and which is the drain is a function of the potential applied to these electrodes.

As is well known in the art, a logic "0" or a logic "1" can be written into and stored in a memory cell 11. Where the operating potential to the memory array is VDD volts (e.g., 5 volts) and ground (e.g., zero volts) it may be assumed, for purpose of illustration, that: (a) a logic "0" or low signal is a signal having a value of zero, or close to zero, volts; and (b) a logic "1" or high signal is a signal having a value of VDD, or close to VDD, volts.

Information is written into a memory cell 11 when its gating transistor is enabled (e.g., turned-on by applying, for example, VDD volts to the WL connected to its gate 13). A logic zero can then be written into the memory cell by applying zero volts to the bit line connected to electrode 14. Capacitor C1 can then be discharged to ground via the drain-to-source path of transistor T1. T1 may then be turned off by the application of zero volts to the WL connected to its gate and C1 will remain at or close to zero volts.

A logic "1" is written into a memory cell when its T1 is turned on, as noted above, and by applying VDD volts to the bit line connected to its drain electrode. Capacitor C1 gets charged up towards VDD via the source-drain conduction path of T1. T1 may then be turned off by the application of zero volts to its gate. Capacitor C1 will remain charged at the high potential ([VDD−Vt] volts) to which it was charged except for the presence of leakage currents which tend to discharge C1 to ground. For purpose of illustration assume that, when a logic "1" is written into a memory cell 11, the storage capacitor, C1, is charged to a voltage of for example +5 volts. Subsequent to writing a "one" (or a "0") into a cell 11, the gate voltage of the memory cell transistor T1 is driven "low" (e.g. zero volts) to turn-off transistor T1. Transistor T1 will remain turned-off (i.e., in a "stand-by" condition) until a subsequent read, refresh or rewrite operation, with the expectation that capacitor C1 will remain charged to, or close to, +5 volts. However, when the gate voltage of T1 is at zero while its drain is at +5 volts the gate is at a negative 5 volts relative to the drain. For extremely small sized transistors, this voltage induces a high electric field at the drain 15 to substrate 16 junction. This high electric field causes leakage current to flow from the drain 15 into the substrate 16, tending to discharge capacitor C1. Referring to FIG. 3C, the capacitor C1 would be discharged via the leakage current (IL) flowing from capacitor C1 through the reverse path of D2 into the substrate 16. If too much charge leaks away, the memory cell will fail to produce a correct output on the next readout.

When the WL to which the gate of T1 is connected is at zero volts, T1 is turned off. Only a sub-threshold current flows in the "main conduction" path located between the source and drain regions of T1. Additionally, a leakage current can flow from C1 via diode D2 into the substrate. These leakage currents tend to discharge C1 and if of sufficient amplitude cause a failure since the value of the data bit stored in the memory cell is destroyed. FIG. 4 is an exemplary diagram showing the flow of current (IDS) in the main conduction path of a transistor as a function of gate voltage and the effect of increasing the turn-off voltage applied to the gate on the flow of leakage current (e.g., gate induced drain leakage, GIDL, current). When the gate-to-source voltage (VGS) is below the threshold voltage (Vt), only sub-threshold current flows in the source-to-drain path. This current decreases with increasing turn-off voltage down to a gate voltage of (−)VA volts as shown in FIG. 4. Applicant also recognized that when the gate-to-source voltage is made slightly negative over a range extending to (−)VA volts, the subthreshold leakage current continues to decrease. The value of (−)VA may range from −1 V to −3 V; the actual number being strongly dependent on the technology and processes used to manufacture the transistors. However, as shown in FIG. 4, if the gate-to-source voltage of an N-type transistor is made significantly more negative than −VA volts (i.e., when the amplitude of the turn-off voltage is increased above a certain level) the leakage current (GIDL) through the parasitic diodes increases significantly, and particularly through D2 when the drain is positively biased by the charge on the storage capacitor.

As noted above, Applicant's invention resides, in part in the recognition that the leakage of transistors of the memory cells of a memory array could be tested for different values of turn-off voltages to determine how the leakage current varies as a function of increasing and decreasing values of turn-off voltages. For N-type transistors these are voltages which make the gate of the transistor negative relative to its source. The testing enables the detection of the location of defective cells so that they can be replaced by cells from a redundant row or column (not shown). Alternatively if there are too many defective cells, so that the redundant rows and columns are insufficient, the memory chip would be rejected. The testing also enables the determination of the optimum turn-off gate voltage or the optimum design of the memory transistors.

Figure 5:
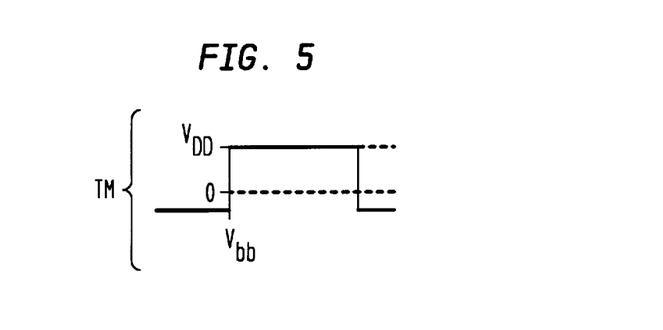
FIG. 5 is a schematic diagram of a decoder/driver circuit embodying the invention.

Applicant's invention also resides in decoder circuitry such as shown in FIG. 5 which enables different voltages (e.g., ground or Vbb volts) to be selectively applied to selected word lines. FIG. 5 includes a transistor P1, as in FIG. 2, for selectively supplying a high voltage to the word line (WL). However, in contrast to FIG. 2, in the circuit of FIG. 5, transistors N1 and N2 are formed in an isolated P-well, 51, to enable a negative bias voltage of Vbb volts to be connected to the P-well 51 at a terminal 52 thereof. Vbb may be, for example, equal to −1 volt. However, Vbb may be selected to be any voltage between Vt and −VA volts. The source electrodes 53s and 54s of N1 and N2 are connected to a node 41. The circuit of FIG. 5 enables the application of either ground or Vbb volts to node 41. Transistors N1 and N2, when enabled, function to couple whatever voltage is present at node 41 to the word line (WL).

The source-to-drain path of a transistor N3 is connected between node 41 and a node 42 to which is applied Vbb volts. In addition, the source-to-drain path of a transistor N4 is connected between node 41 and a node 43 to which is applied ground potential. The substrates of transistors N3 and N4 and the source of N3 are connected to a terminal 55 to which is applied Vbb volts. A test signal denoted as TM is applied to the gate of N3 and to the input 45 of an invertor 46 whose output is applied to the gate of N4 and whose operating potential is VDD and Vbb.

The operation of the circuit of FIG. 5 is as follows. Assume that the test signal TM has either a "low" value of Vbb volts, which defines the "standard" or "normal" condition, or a "high" value of VDD volts, which defines the "test" condition for which an increased turn-off voltage is made available for application to the word lines. Thus, during the standard operating condition, when TM is low, the output of invertor 46 is high and this high is applied to the gate of transistor N4 turning it on. When N4 is turned-on, it clamps node 41 to ground. Concurrently, the application of Vbb volts to the gate of N3 causes it to be turned-off. Thus, during the standard operating condition the sources of transistors N1 and N2 are returned to ground via the relatively low source-to-drain impedance of N4. When transistors N1 and/or N2 are turned-on the ground potential at node 41 is then applied to the word line (WL).

During the test operating condition, the signal TM goes high to VDD volts. The TM high signal applied to the input of invertor 46 causes its output to go to Vbb volts, which voltage is applied to the gate of N4, causing it to turn-off. Concurrently, the high TM signal is applied to the gate of transistor N3 causing it to turn-on. When N3 is turned on, it clamps node 41 to the Vbb volts applied to terminal 55, and thus makes Vbb volts available at the sources of transistors N1 and N2.

The operation of the decoder circuit of FIG. 5 may thus be summarized as follows. For the condition where RDEC or WLK (or both) are high, the word line (WL) is clamped to node 41 via either one or both of N1 and N2. The voltage at node 41 will either be equal to ground if TM is low or will be at Vbb volts if TM is high. Thus, the circuit of FIG. 5 enables the application of either ground potential or Vbb volts to the word line. For the condition when RDEC and WLK are low and WLD is high (e.g., VDD), a high is applied to WL turning on the N-type memory cell transistors whose gates are connected to WL.

With the circuit of FIG. 5 incorporated into the row decoder and driver circuit 20 of FIG. 1, the memory array 10 can be tested for leakage under standard operating condition (ground applied to selected, or all, the word lines) or under "test" conditions when a negative voltage is applied to certain (or all) word lines.

In the standard operating mode, the signal TM is set at a "low" value (e.g., Vbb volts). A "high" (e.g., VDD volts) may be written into all (or only selected) memory cells of the array by charging their storage capacitors to, or close to, VDD volts. After the "high" write operation, the decoder couples a voltage of zero volts to certain (or all) word lines of the memory array for a predetermined period of time. Following the predetermined period of time, the memory cells into which a "high" was written may be read out onto the bit lines and to the sense amplifiers to determine the level of the leakage and/or whether the data stored in the memory cell has been maintained.

In the "test" mode condition, the signal TM is set at a "high value (e.g., VDD volts). This makes it possible for the decoder circuit to subsequently apply a voltage of Vbb volts (e.g., −1 volt) to the word lines. A "high" (e.g., VDD volts) may be written into all (or only selected) memory cells of the array by charging their storage capacitors to, or close to, VDD volts. After the "high" write operation, the decoder couples a voltage of Vbb volts to certain (or all) word lines of the memory array for a predetermined period of time. Following the predetermined period of time, the memory cells into which a "high" was written may be read out onto the bit lines and to their corresponding sense amplifiers to determine the level of the leakage and/or the extent to which the data stored in the memory cell has been maintained. The testing of the memory array 10 may be repeated for many different increasing values of turn-off voltage ranging from Vt volts to −VA volts (and even more negative). The results of the testing of the memory cells under standard conditions may be compared to the results obtained under one or more "test" conditions. The comparison may be used to detect the location of weak or bad cells exhibiting too much leakage or a susceptibility to leak, and their replacement with "good" cells from redundant rows and columns. Alternatively, the testing may be used to reject defective chips. Still further, the testing may indicate the optimum range of gate voltage ranging between Vt and −VA to be applied to the memory system for lowest leakage operation.

It should be evident that the circuit of FIG. 5 allows for the easy application of different values of turn-off voltage to the word lines of the array. During the testing of the memory array the voltage Vbb may be varied in steps over a range which may extend, for example, from Vt volts to −3 volts, or more. This allows for determining the optimum turn-off voltage to be applied to minimize leakage currents, and the needed margin for safe operation. It should also be evident that, as a result of the testing, the memory chip may be provided with circuitry (not shown) such that the word line voltage varies between VDD (for turn on) and an optimum turn-off voltage which may be other than zero volt.

Figure 6A:
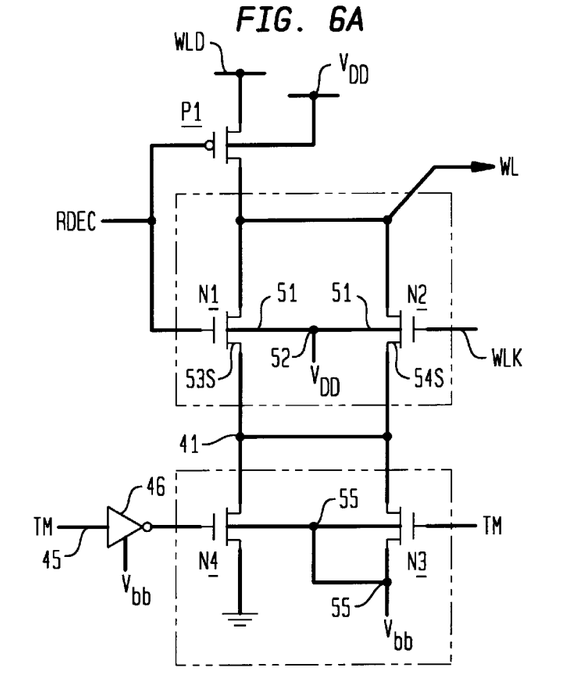
FIG. 6 is a schematic diagram of another decoder/driver circuit embodying the invention.
Figure 6B:
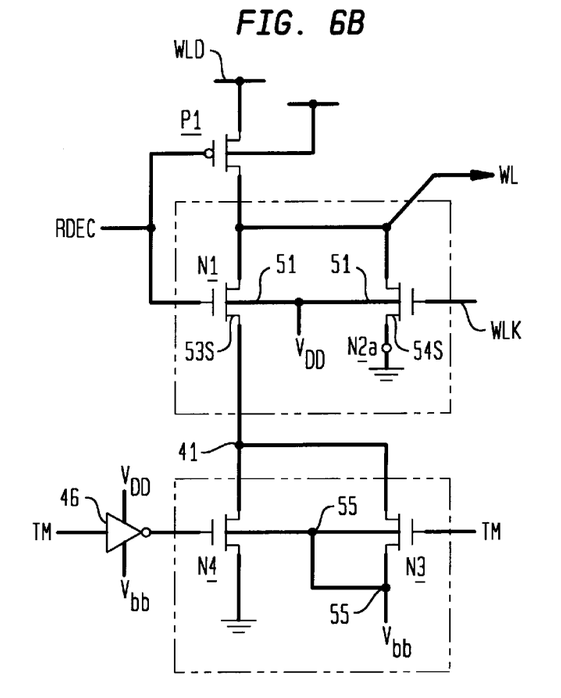

The circuit of FIG. 5 may be modified as shown in FIG. 6, where the source of N2a is connected to ground while the source of N1 remains connected to node 41 to which is connected the drains of N3 and N4. In the circuit of FIG. 6, N2 must be turned off when the signal TM is high to avoid dividing the Vbb volts.

The circuits and their operation have been described assuming the memory cell transistors (T1) to be of N conductivity-type. However, it should be understood that P-type transistors could be substituted with the appropriate change in applied voltage, (e.g., a P-type transistor turns off when its gate voltage is equal to or more positive than its source voltage, and the source of a P-type transistor is that electrode having the more positive potential applied thereto).

What is claimed is:

1. A memory system comprising:

a memory array of cells arranged in M rows and N columns, each row having a row conductor and each column having a column conductor, with a cell being formed at the intersection of a row conductor and a column conductor, and each cell including a transistor and a storage capacitor, each transistor having first and second electrodes defining the ends of a main conduction path and a gate electrode, with each transistor having its gate electrode connected to its corresponding row conductor, one end of its conduction path connected to its corresponding column conductor and the other end of its conduction path connected to its storage capacitor; and select circuit, said select circuit selectively applying a turn-off voltage to selected row conductors for turning off conduction in the main conduction paths of the transistors whose gate electrodes are connected to the selected row conductors, and selectively applying an increased turn-off voltage to selected row conductors.

2. A memory system as claimed in claim 1, wherein said select circuit for selectively applying a turn-off voltage and an increased turn-off voltage includes: (a) row decoding circuitry connected between each row conductor and a first node; and (b) means for selectively applying a voltage to said first node having either a value equal to said turn-off voltage or a value equal to said increased turn-off voltage.

3. A memory system as claimed in claim 2, wherein said row decoding circuitry includes a first selectively enabled decoding transistor having its conduction path connected between its associated row conductor and said first node; and wherein said means for selectively applying a voltage to said first node includes: (a) a first switch coupled between said first node and a first point of reference potential; (b) means for applying said turn-off voltage to said first point of reference potential; (c) a second switch coupled between said first node and a second point of reference potential; (d) means for applying said increased turn-off voltage to said second point of reference potential; and (e) means for selectively enabling one of said first and second switch.

4. A memory system as claimed in claim 3, wherein each one of said row decoder circuits includes a second selectively enabled decoding transistor having its conduction path connected in parallel with the first decoding transistor.

5. A memory system as claimed in claim 3 wherein each one of said row decoder circuits includes a second selectively enabled decoding transistor having its conduction path connected between its row conductor and a third point of reference potential.

6. A memory system as claimed in claim 2, wherein each memory cell transistor is a transistor of N-type; wherein said turn-off voltage is ground potential; and wherein said increased turn-off voltage is more negative than the ground potential.

7. A memory system comprising:

a first transistor having its conduction path connected between a first signal terminal and an output terminal;

means connecting the output terminal to the gate electrodes of a row of memory cells;

a second transistor having its conduction path connected between said output terminal and a second terminal;

means for applying a first decoded signal to the gate electrodes of said first and second transistors;

means for applying a second decoded signal to the first signal terminal;

means for selectively applying a first voltage or a second voltage to said second terminal, said first voltage having an amplitude and polarity to turn-off any memory cell transistor having its gate electrode connected to said output terminal and said second voltage having an amplitude and polarity to further turn-off said memory cell transistors.

8. A memory system as claimed in claim 7 wherein said first transistor is of a first conductivity type; and wherein said second transistor is of a second conductivity type.

9. A memory system as claimed in claim 8, wherein said means for applying a first or a second voltage includes: (a) a third transistor having its conduction path connected between said second terminal and a first point of potential to which is applied said first voltage; (b) a fourth transistor having its conduction path connected between said second terminal and a second point of potential to which is applied said second voltage; and (c) means connected to said third and fourth transistors for turning only one of them on at a time.

10. A memory system as claimed in claim 9, further including a fifth transistor having its conduction path connected in parallel with the conduction path of the second transistor.

11. A memory system as claimed in claim 9, further including a fifth transistor having its conduction path connected at one end to said output terminal, at its other end to a point of reference potential, and responsive to a turn on signal for clamping the output terminal to said point of reference potential.

12. A memory system comprising:

a memory array of cells arranged in M rows and N columns, each row having a row conductor and each column having a column conductor, with a cell being formed at the intersection of a row conductor and a column conductor, and each cell including a transistor and a storage capacitor, each transistor having first and second electrodes defining the ends of a conduction path and a gate electrode, with each transistor having its gate electrode connected to its corresponding row conductor, one end of its conduction path connected to its corresponding column conductor and the other end of its conduction path connected to its storage capacitor;

a row decoder and driver having M outputs, each output being connected to a corresponding row conductor, said row decoder and driver including means for selectively supplying to each one of its outputs a first voltage for enabling the memory transistors whose gates are connected to the corresponding row conductor, and a second voltage for turning off these memory transistors; and said row decoder and driver including means for selectively supplying a third voltage having a polarity and magnitude to further turn-off the memory transistors.

13. A memory system as claimed in claim 12, wherein said row decoder and driver includes a driver circuit per each one of said M outputs, each driver circuit comprising:

a first transistor having its conduction path connected between a first signal terminal and an output terminal;

means connecting the output terminal to a row conductor to which are connected the gate electrodes of a row of memory cells;

a second transistor having its conduction path connected between said output terminal and a second terminal;

means for applying a first decoded signal to the gate electrodes of said first and second transistors;

means for applying a second decoded signal to the first signal terminal;

means for selectively applying a first voltage or a second voltage to said second terminal, said first voltage having an amplitude and polarity to turn-off any memory cell transistor having its gate electrode connected to said output terminal and said second voltage having an amplitude and polarity to further turn-off said memory cell transistors.

14. A method for testing the data retention capability of the memory cells of a dynamic random access memory (DRAM), wherein the memory cells are arranged in M rows and N columns, each row having a word line and each column having a bit line, with a memory cell being formed at the intersection of each word and bit line, and each memory cell including a transistor and a storage capacitor, each transistor having first and second electrodes defining the ends of a main conduction path and a gate electrode, with each transistor having: (a) its gate electrode connected to its corresponding word line; (b) one end of its conduction path connected to its corresponding bit line; and (c) the other end of its conduction path connected to its storage capacitor; wherein the DRAM includes write/sense circuitry coupled to the bit lines for writing information into or reading information from selected memory cells; and wherein the method for testing comprises the steps of:

writing information into selected memory cells;

applying a first turn-off voltage for a first time period to the word lines of selected memory cells for turning-off selected memory cell transistors for the first time period;

sensing the retention of the information stored within selected memory cells after said first time period;

writing information into selected memory cells after the sensing operation;

applying a second turn-off voltage for a second time period to the word lines of selected memory cells for turning-off selected memory cell transistors for the second time period, where the second voltage is of greater turn-off amplitude than said first turn-off voltage; and sensing the retention of the information stored within selected memory cells after said second time period.

* * * * *